May 13, 1969 A. R. WISE 3,443,944

METHOD OF DEPOSITING CONDUCTIVE PATTERNS ON A SUBSTRATE

Filed Oct. 23, 1963

INVENTOR.
ANN R. WISE
BY
Shenier & O'Connor
ATTORNEYS

United States Patent Office 3,443,944
Patented May 13, 1969

3,443,944
METHOD OF DEPOSITING CONDUCTIVE PATTERNS ON A SUBSTRATE

Ann R. Wise, Natick, Mass., assignor to United Aircraft Corporation, East Hartford, Conn., a corporation of Delaware Filed Oct. 23, 1963, Ser. No. 318,214
Int. Cl. G03c *5/00*
U.S. Cl. 96—36.2 3 Claims My invention relates to a method of depositing conductive patterns on a substrate and more particularly to an improved method for depositing microcircuit patterns which is simpler and more expeditiously carried out than are processes of the prior art.

There are many instances in which micropatterns of conductive material must be deposited on a substrate. For example, printed circuits, microminiature circuits, name plates and interconnection of functional circuits all require such deposits. The deposits must be applied to a wide variety of substrates such, for example, as silicon, silicon dioxide, copper, stainless steel, glass, ceramics and epoxy potting compounds.

In the prior art the usual practice is depositing a film of the pattern forming metal on a nonconducting substrate. After the metal film has been applied to the substrate, it is coated with an organic insulating photosensitive material of a type known to the art. After the resist has been applied, it is exposed to ultraviolet light through a transparent mask carrying the desired pattern. The exposed portions of the resist are developed in an organic solvent such as trichlorethylene and the unexposed resist washes away. Next, the unwanted metal, which is now exposed, is etched away with the desired pattern being protected by the developed resist pattern. This may be achieved, for example, using hydrofluoric acid which will attack the metal but not the resist.

The process described above embodies a number of defects. It is extremely difficult to maintain the required pattern definition during etching and often the photoresist cannot withstand the action of the harsh etchant for the time required completely to remove the unwanted metal. Undercutting of the desired pattern is a problem in many cases and sometimes the resist may completely lift off the metal during etching.

It has been suggested that, in order to decrease undercutting, conversion coatings may be employed. This procedure has the obvious disadvantage of adding to the number of process steps.

When etching is completed, the photoresist covering the desired pattern must be removed by soaking, boiling, or swabbing in a solvent which attacks the resist. Resist removal in this manner is difficult.

It will be seen that the process described above embodies all the problems of undercutting and loss of pattern definition as well as necessitating a relatively large number of process steps.

As an alternative to the process outlined above, it has been proposed that a negative of the desired pattern be formed directly on the substrate and then the metal be deposited by vapor deposition or the like to form the desired pattern. This process embodies the disadvantage that the deposited metal "mushrooms" resulting in loss of pattern definition.

I have invented a process of producing micropatterns of conductive material on a substrate which overcomes the disadvantages of processes of the prior art described hereinabove. My process includes fewer steps than do processes of the prior art and consequently, is simpler and more expeditiously carried out. My process results in improved pattern definition over processes of the prior art. The danger of chemical contamination of the substrate is substantially reduced in my process.

One object of my invention is to provide a process for producing micropatterns of conductive material which is simpler and more expeditiously performed than are processes of the prior art.

A further object of my invention is to provide a process for producing a micropattern of conductive material which includes fewer steps than do processes of the prior art.

Another object of my invention is to provide a process for producing micropatterns of conductive material which have a high pattern definition.

A still further object of my invention is to provide a process for producing a micropattern of conductive material wherein the danger of chemical contamination of the substrate is substantially eliminated.

Still another object of my invention is to provide a process having a wide range of application.

Other and further objects of my invention will appear from the following description.

In general my invention contemplates a process for applying a conductive micropattern to a substrate in which I apply a layer of a mixture of photoresist and powdered metal to the substrate and photographically produce the desired pattern of the mixture of photoresist and metal. After this has been done, I remove all the photoresist to leave the desired high definition conductive micropattern.

In the accompanying drawings which form part of the instant specification and which are to be read in conjunction therewith and in which like reference numerals are used to indicate like parts in the various views.

Figure 1:
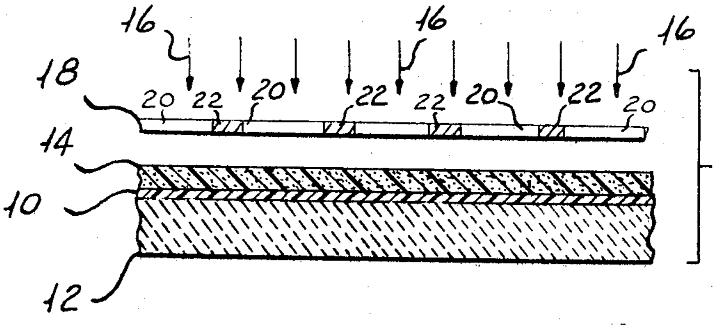
FIGURE 1 illustrates one step in my process for producing a conductive micropattern.
Figure 2:
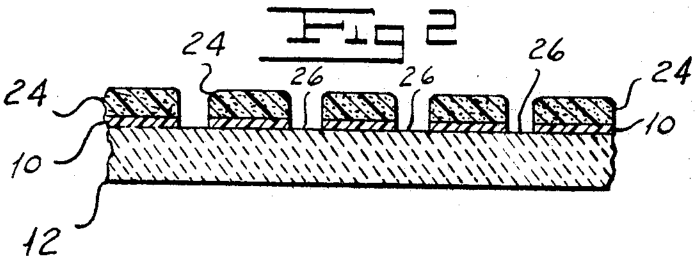
FIGURE 2 is a sectional view of the resulting wafer produced by the method illustrated in FIGURE 1.

Referring now to the drawings, in practicing my method I first apply a thin film 10 of photosensitive organic material of a type known to the art to a substrate 12. The substrate 12 may be any suitable material on which it is desired to produce a conductive micropattern. For example, it may be silicon, silicon dioxide, copper, stainless steel, glass, ceramics, epoxy potting material or the like. The organic photosensitive material 10 is known to the art as "photoresist" or "resist."

I apply the thin film 10 of about 0.1 mil thickness of unmixed photoresist material to the substrate 12 to facilitate removal of fine metal particles in the unwanted areas as will be apparent from the description hereinbelow.

After having applied the film 10 to the substrate 12 and when this film is dry, I next apply a layer 14 of a mixture of the conductive metal, of which the pattern is to be formed, and photoresist to the film 10. To achieve this result, I mill up to about 40% by weight of the desired metal into the photoresist. The particle size I use is determined by the resolution required in the final pattern. For example, in the formation of a micro-miniature circuit, ultrafine metal powders of extremely high purities are obtained with a particle size of less than 0.1 micron. I may use any suitable metal such, for example, as aluminum, copper, silver, iron, nickel or the like. It will readily be apparent that the time required for the milling operation will vary with the viscosity of the photoresist material and with the amount of metal required to be dispersed in the photoresist.

After having applied the layer 14 to the film 10, I expose the layer and film to ultraviolet light indicated by the arrows 16 in FIGURE 1 through a mark 18. Mask 18 is formed with transparent openings 20 defined by opaque portions 22 so that the openings 20 correspond to the pattern of conductive material which it is desired to deposit on the substrate 12.

After the layer 14 and film 10 have been exposed to the desired pattern of ultraviolet light in the manner described above, the exposed portions are developed in a suitable liquid such, for example, as trichlorethylene and the unexposed portions of the resist are washed away. It will readily be appreciated that the unmixed resist film 10 ensures that no metal particles are left in the areas of the substrate 12 which are exposed during the developing process. After development, the substrate 12 carries a plurality of areas 24 of developed resist and metal and areas 26 of the substrate 12 between the areas 24 are exposed.

Figure 3:
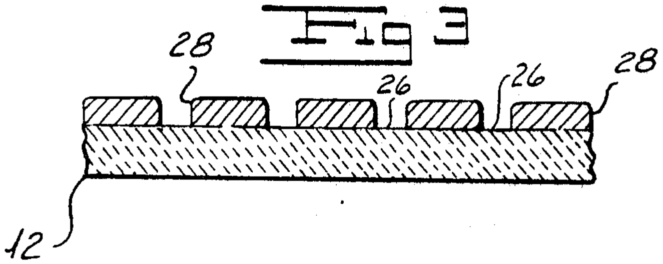
FIGURE 3 is a sectional view illustrating the wafer of FIGURE 2 after all the photoresist material has been removed.

In the next step of my process, I remove all of the remaining developed resist by subjecting the resist to a temperature of above 500° C. Above this temperature the resist burns off leaving substantially no ash and only the desired metal pattern which may comprise areas 28 as shown in FIGURE 3. If the material of the substrate 12 is such that it is unable to withstand the temperature required to burn off the developed resist, then a hot gas may be passed across the surface of the wafer to burn off the resist without damaging the substrate 12. To ensure a continuous film, the metal may be exposed to a temperature sufficient to cause it to flow together. If desired, the thickness of the metal may be increased by electroplating or electroless plating in applications in which such techniques are suitable.

Figure 4:
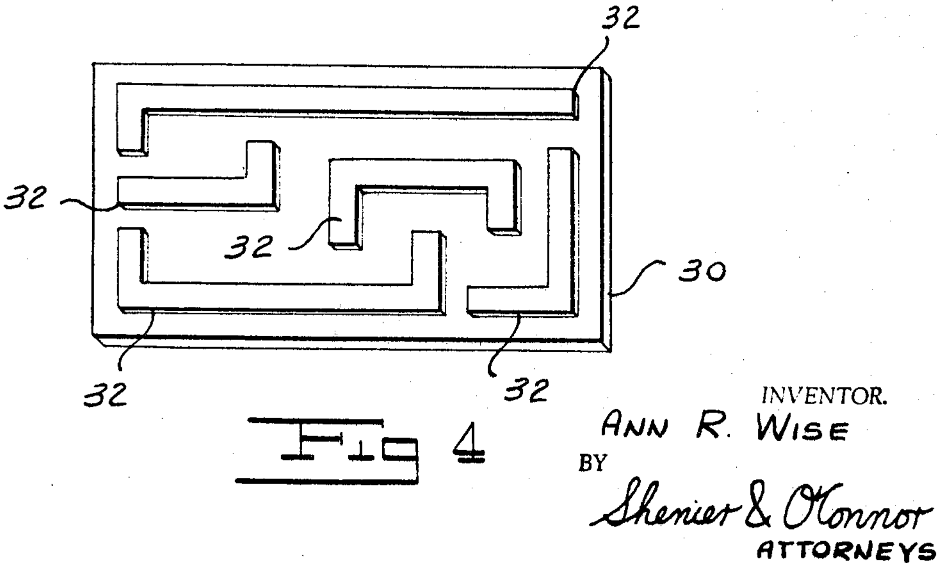
FIGURE 4 is a perspective view illustrating one type of pattern which can be produced by my method.

Referring to FIGURE 4, there is shown one example of a pattern of conductive material which may be deposited by practicing my method. A substrate 30 carries a plurality of differently shaped areas 32 of conductive material providing the desired pattern.

By way of summary, in practicing my method, I apply a thin film 10 of unmixed photoresist to the substrate 12 to which the conductive pattern is to be applied. I then apply the layer 14 of a mixture of powdered metal and photoresist and expose this layer and film 10 to a pattern of ultraviolet light 16 through the mask 18. Then, the exposed areas 24 are developed and the unexposed resist is washed away to leave areas 26. Next, the wafer is subjected to heat to burn off the remaining photoresist to leave only the metal areas 28.

The advantages of my process vary with the particular application of the process. In the manufacture of semiconductor circuits, it eliminates the need for vacuum deposition of the contact and interconnecting metal. In the prior art this procedure requires two or three different alignments in order to produce one metal pattern. Moreover, processes of the prior art require etching with the resultant difficulties of undercutting and possible contamination by the etchants. The problem of resist removal after fabrication is eliminated. More significant, the number of steps of my process is greatly reduced over the number of steps required in the prior art.

In its application to interconnecting operations such as are involved in printed circuits my process has many of the same advantages. Moreover, it permits the application of conductive patterns to ceramic substrates which have a high modulus of elasticity. Adhesion is superior to that resulting from electroless plating which is usually employed. Where the pattern is applied to a transparent material, the metal-resist mixture eliminates halation problems encountered during exposure owing to the opacity of the metal-resist mixture. Since the mixture is opaque, there is no loss of pattern definition from reflection through the transparent substrate on exposure.

It will be seen that I have accomplished the objects of my invention. I have provided a method for producing micropatterns of conductive material which is simpler and more expeditiously performed than are methods of the prior art. My method provides high pattern definition. It incorporates fewer steps than do methods of the prior art. It greatly reduces the danger of contamination of the substrate material. It has a wide application and has advantages in all applications.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A method of producing a pattern of conductive material on a carrier including applying a thin film of clear photo-resist to said carrier, applying a layer of the mixture of a minor amount of finely divided metal and a major amount of photo-resist to said film, exposing said layers to light in the desired pattern, removing the said metal and photo-resist in the unexposed areas and then subjecting the remaining materials to heat to remove the photo-resist components and to form the desired pattern of metal.

2. A method of producing a pattern of conductive material on a carrier including the steps of applying a thin film of clear photo-resist to said carrier, applying a layer of a mixture of photo-resist and conductive material over said film, exposing said layer to light in the desired pattern, subjecting the remaining material to heat to remove the said conductive material and photo-resist in the unexposed areas and then removing the remaining photo-resist to form the pattern of conductive material.

3. A method of producing a pattern of conductive material on a carrier including the steps of applying a thin film of clear photo-resist to said carrier, applying a layer consisting of the mixture of a minor amount of finely divided metal and a major amount of photo-resist to said film, exposing said layers to light in the desired pattern, removing the said metal and photo-resist in the unexposed areas and then subjecting the remaining materials to heat to remove the photo-resist components and to form the desired pattern of metal.

References Cited

UNITED STATES PATENTS

| | | | |
|---|---|---|---|
| 2,195,531 | 4/1940 | Gaut et al. | |
| 2,443,119 | 6/1948 | Rubin. | |
| 2,585,700 | 2/1952 | Strickman. | |
| 2,897,089 | 7/1959 | Ahlburg. | |
| 2,914,404 | 11/1959 | Fanselau et al. | 96—36.2 |
| 3,146,368 | 8/1964 | Fiore et al. | 96—36.1 X |
| 3,222,173 | 12/1965 | Belko et al. | 96—38 X |

FOREIGN PATENTS

| | | |
|---|---|---|
| 602,695 | 8/1960 | Canada. |

OTHER REFERENCES

Grant, J.: Hackh's Chemical Dictionary, 3rd ed., McGraw-Hill Book Co., New York, 1944, p. 349 relied on.

J. TRAVIS BROWN, *Primary Examiner.*

C. BOWERS, *Assistant Examiner.*

U.S. Cl. X.R.

96—34, 36.1, 38.4

UNITED STATES PATENT OFFICE

CERTIFICATE OF CORRECTION

Patent No. 3,443,944 May 13, 1969

Ann R. Wise

It is certified that error appears in the above identified patent and that said Letters Patent are hereby corrected as shown below:

Column 4, line 35, beginning with "subjecting" cancel all to and including "removing" in line 37, same column 4, and insert -- removing the said conductive material and photo-resist in the unexposed areas and then subjecting --.

Signed and sealed this 21st day of April 1970.

(SEAL)
Attest:

Edward M. Fletcher, Jr.
Attesting Officer

WILLIAM E. SCHUYLER, JR.
Commissioner of Patents